United States Patent [19]

Serr et al.

[11] Patent Number: 4,771,367

[45] Date of Patent: Sep. 13, 1988

[54] ELECTRIC PLUG WITH CIRCUIT BREAKER

[75] Inventors: Michael J. Serr; Carlyle Serr; Lawrence E. Pierce, all of Holland, Mich.

[73] Assignee: High Q Manufacturing Co., Holland, Mich.

[21] Appl. No.: 46,258

[22] Filed: May 4, 1987

[51] Int. Cl.[4] .............................................. H05K 5/00

[52] U.S. Cl. .................................. 361/394; 361/102; 361/376; 361/417; 361/419; 439/622

[58] Field of Search ............. 200/51 R; 337/112, 113, 337/197, 198, 380, 381; 361/58, 91, 92, 102, 104, 112, 113, 334, 357, 380, 381, 394, 395; 439/621, 622

[56] References Cited

U.S. PATENT DOCUMENTS

| | | | |
|---|---|---|---|
| D. 246,241 | 11/1977 | Jacobs | D13/28 |
| D. 270,628 | 9/1983 | Bobrovniczky | D13/28 |
| D. 280,894 | 10/1985 | Dickey | D13/34 |
| 3,873,951 | 3/1975 | Blake | 335/164 |
| 4,086,643 | 4/1978 | Jacobs | 361/92 |
| 4,307,925 | 12/1981 | Drew | 439/622 |
| 4,484,185 | 11/1984 | Graves | 340/656 |
| 4,488,201 | 12/1984 | Webb et al. | 361/334 |
| 4,567,544 | 1/1986 | Ronemus et al. | 361/395 |
| 4,679,884 | 7/1987 | Klemp | 337/198 |

FOREIGN PATENT DOCUMENTS

| | | | |
|---|---|---|---|
| 1303127 | 12/1962 | France | 337/198 |

*Primary Examiner*—J. R. Scott
*Assistant Examiner*—Gregory P. Thompson
*Attorney, Agent, or Firm*—Price, Heneveld, Cooper, DeWitt & Litton

[57] ABSTRACT

The specification discloses an injection-molded electric plug having an integral circuit breaker. The plug housing is molded directly onto the power cord and defines a circuit breaker chamber. A circuit breaker is slidably received within the chamber and retained therein by spring fingers. The housing is elongated and the prongs extend from one of the long sides thereof so that the housing lays substantially flat against a receptacle. The prongs are angularly oriented with respect to the elongated body so that the body will not overlie adjacent receptacle outlets.

4 Claims, 2 Drawing Sheets

ELECTRIC PLUG WITH CIRCUIT BREAKER

BACKGROUND OF THE INVENTION

The present invention relates to electric plugs, and more particularly to such plugs incorporating integral over-current protection such as circuit breakers.

A wide variety of devices have been developed for providing over-current protection at the electric plug. One such approach is to provide a circuit breaker box interposed between a conventional electric plug and a conventional outlet receptacle. This device is disclosed in U.S. Pat. No. 4,484,185, issued Nov. 20, 1984, to Graves entitled SAFETY PLUG ADAPTOR. However, such devices protrude excessively from the outlet, creating safety problems and preventing appliances from being placed against the wall in which the plug is mounted. Further, the necessity of a separate box creates inventory and installation problems. Third, the box must be secured to the receptacle cover plate further complicating the construction and use of this device.

A second type of electric safety plug is illustrated in U.S. Pat. Nos. 4,086,643 and Des. 246,241 issued Apr. 25, 1978 and Nov. 1, 1977, respectively, to Jacobs, entitled COMBINATION PLUG AND POWER CUT-OFF UNIT. This plug includes a hollow multi-piece housing which supports the power cord connection, a circuit breaker, and the prong assembly. The breaker trips whenever excessive current is conducted through the prongs. This plug also suffers several disadvantages. First, its profile is excessively large so that the assembly protrudes undesirably from the receptacle. Second, the multi-piece housing can come open exposing dangerous electric connections. Third, the many pieces required to assemble this plug create inventory and assembly problems.

A third type of electric safety plug is sold by The Belden Division of Cooper Industries located in Geneva, Ill. This plug includes a plug body integrally molded over the end of a power cord and integrally supporting common and ground prongs. The housing also defines a bayonet fuse socket. A bayonet fuse with an integral power prong mounted thereon is releasably secured within the socket. If excessive current flows through the power prong, the integral fuse blows and power is interrupted. To reestablish the connection, the plug must be withdrawn from the outlet; the bayonet fuse must be removed; a proper bayonet replacement fuse must be located and reinstalled within the plug housing; and the plug must be reinserted into the outlet. This plug has several drawbacks. First, the plug must be removed from the receptacle each time the fuse is to be checked or replaced. Second, an inventory of fuses must be maintained to provide replacement capability. Third, the plug is relatively expensive to operate since the fuse-and-prong assembly must continually be replaced.

SUMMARY OF THE INVENTION

The aforementioned problems are overcome in the present invention wherein an electric safety plug is provided including an integral circuit breaker in a low profile housing. In a first embodiment of the invention, the plug includes an injection-molded housing molded directly onto the end of a power cord. The housing integrally supports the plug prongs and also a circuit breaker connected in series with one of the prongs. All electric connections are encapsulated within the molded plug housing and therefore cannot become exposed during rough handling of the plug. The relatively simple construction reduces the number of parts, and hence the cost, of the plug.

In a second aspect of the invention, the housing is elongated, and the prongs extend from one of the elongated faces. Consequently, when the plug is installed within a outlet, the elongated plug body lies relatively flat against the wall. Further in this embodiment, the plug prongs are angularly oriented with respect to the elongated body so that the body will not overlie an adjacent outlet when mounted in a first outlet. This enables multiple plugs to be utilized side-by-side in duplex outlets.

In a third aspect of the invention, these two features are combined to provide an integrally molded elongated plug housing which integrally supports the plug prongs and circuit breaker. The power cord enters one end and the circuit breaker is positioned within the opposite end so that the plug has a low profile against the wall.

These and other objects, advantages, and features of the invention will be more readily and understood and appreciated by reference to the detailed description of the preferred embodiment of the drawings.

DETAILED DESCRIPTION OF THE PREFERRED EMBODIMENT

Figure 1:
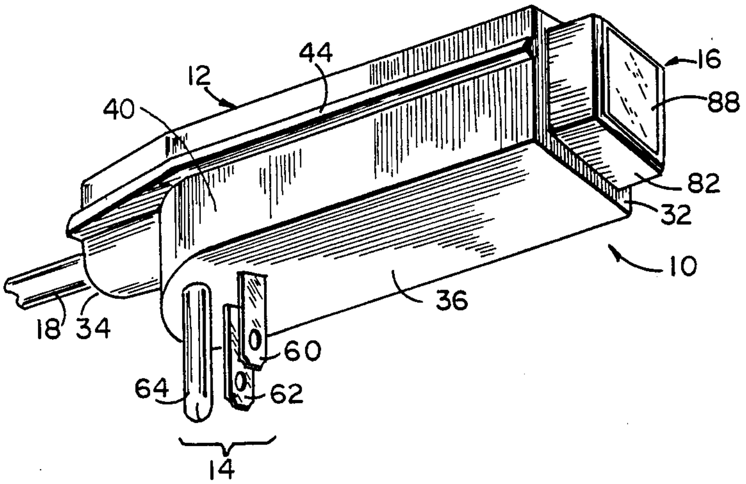
FIG. 1 is a perspective view of the electric safety plug.
Figure 2:
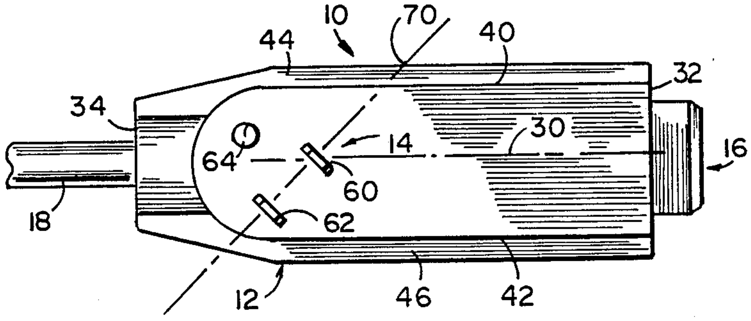
FIG. 2 is a front elevational view of the plug.
Figure 3:
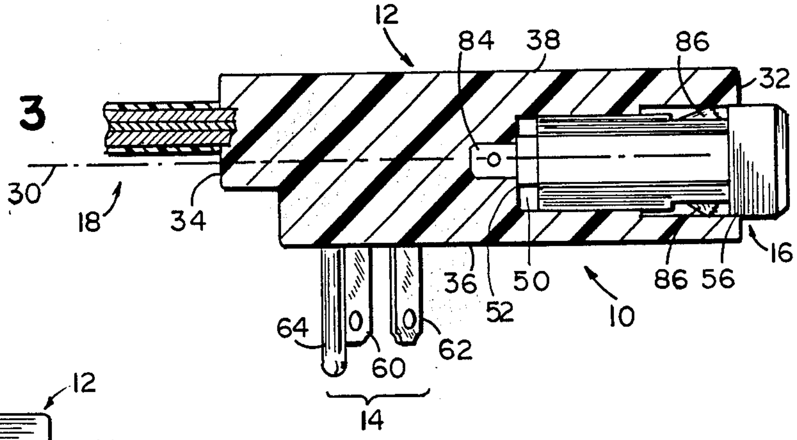
FIG. 3 is a longitudinal sectional view through the plug.

A safety electric plug constructed in accordance with a preferred aspect of the invention is illustrated in the drawings and generally designated 10. Basically, the plug includes a plug housing or body 12, a prong assembly 14, and a circuit breaker or other over-current protection means 16. The one-piece housing 12 is integrally molded onto the power cord 18 and integrally supports both the prong assembly 14 and the circuit breaker 16. Consequently, the present plug provides integral over-current protection in a compact low-profile assembly.

The housing 12 (FIGS. 1–3 and 7) is preferably injection molded to provide a unitary support mechanism for the remaining components. The housing is elongated including a longitudinal axis 30 and includes opposite relatively narrow top and bottom ends 32 and 34. The bottom end 34 is integrally molded onto the power cord 18 to provide a secure interconnection between the housing and power cord. The cross-sectional configuration of the plug perpendicular to the axis 30 is generally rectangular so that the plug includes a front face 36, a rear face 38, and left and right faces 40 and 42. Gripping ridges 44 and 46 extend the full length of the left and right sides 40 and 42, respectively, to provide a mechanism by which the plug housing can be more easily grasped.

Figure 7:
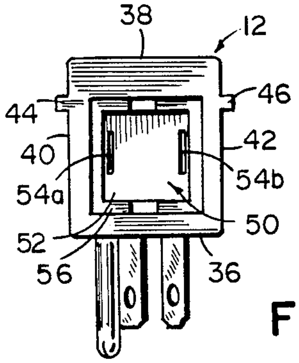
FIG. 7 is a top plan view of the plug housing only.

The housing 12 defines a chamber 50 (FIG. 3) which opens through the top end 32. The chamber is generally elongated and oriented generally parallel to the axis 30. As seen in FIG. 7, the chamber 50 is generally square in cross section and extends from the top end 32 to a floor 52 which is approximately midway along the length of the housing 12. A pair of slots 54*a* and 54*b* are defined in the floor 52 of the chamber 50 to receive prongs on the circuit breaker as will be described. The perimeter 56 of the opening of the chamber 50 receives the face of the circuit breaker.

The power cord 18 (FIGS. 3 and 5) is generally well known to those having ordinary skill in the art. This is a three-conductor cord including power, common, and ground conductors. The power cord 18 includes an insulating/protective jacket preferably of the same color as the housing 12.

The prong assembly 14 (FIGS. 1–2 and 5) is mounted within the front face 36 at a location proximate the bottom end 34. The prong assembly includes a power prong 60, a power prong (also referred to as a common prong) 62, and a ground prong 64. Preferably, the prongs are fabricated of copper to provide good electric conductivity. The prongs are electrically connected to the conductors within the power cord 18 as will be described. The prongs are sized and arranged to interfit with a conventional receptacle outlet as is well known to those having ordinary skill in the art. The housing 12 is integrally molded about the prongs such that the prongs are integrally and directly supported by the housing. Such structure eliminates the necessity of additional structure for supporting the prong assembly 14. The prongs are generally perpendicular to the axis 30 (see FIG. 3). Further, an imaginary line 70 drawn through the two power prongs 60 and 62 forms an acute angle with the axis 30. Although an angle of approximately forty-five degrees is disclosed, this angle should be substantially nonperpendicular. Preferably, the angle should be in the range zero degrees to approximately forty-five degrees as will be described.

Figure 4:
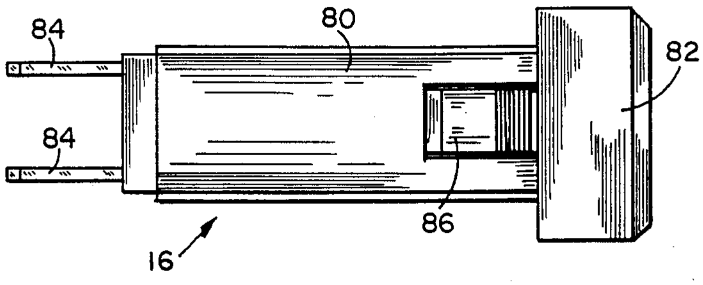
FIG. 4 is a front elevational view of the circuit breaker.

The circuit breaker 16 (FIGS. 3 and 4) are generally well known in the art and are typically referred to as panel breakers since they are most commonly installed within planar control panels. The breaker used in the preferred embodiment is that sold by Mechanical Products, Inc. of Jackson, Mich. as the 2000 Series. The breaker generally includes a body 80 defining a face 82 at one end and integrally supporting prongs 84 at its opposite end. The breaker body is plastic and includes upper and lower spring fingers or other ratchet means 86 which lock the breaker within the chamber 50. The prongs 84 interfit with the slots 542 and 546 in the floor 52 of the chamber 50 to make electric connection with the power conductor in the cord 18 through one slot and the power prong 60 through the other slot. The face 82 fits closely within the perimeter 56 so that the facing 82 is slightly recessed within the housing end 32. As seen in FIG. 1, the breaker further includes a reset button 88 which can be depressed, or pushed in the direction of housing 12, to rest the breaker after it is tripped. The breaker body 80 is generally closely received within the chamber 50. The spring fingers 86 ratchet against the walls of the chamber 50 permitting the breaker to be slid into the chamber 50 during installation but not easily subsequently withdrawn. The breaker capacity will be selected depending on the application. Currently anticipated capacities are in the range 0.25 to 15 amps.

Figure 5:
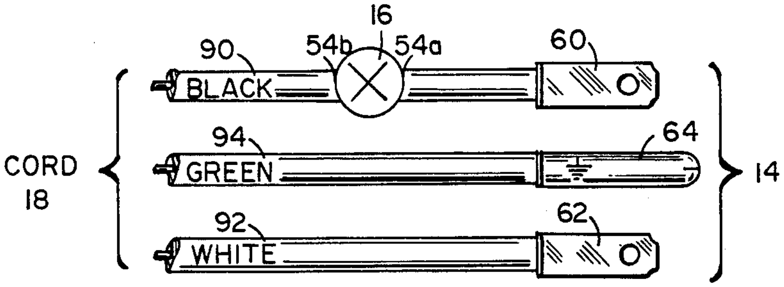
FIG. 5 is a schematic diagram of the electric connections within the plug.

The electric interconnections in the plug are schematically illustrated in FIG. 5. The power cord 18 includes a power conductor 90, a common conductor 92, and a ground conductor 94. The circuit breaker 16 is coupled in series with the power prong 60. Specifically, electric connections, (not specifically shown) are provided in sockets 54*a* and 54*b* by which means the circuit breaker 16 is connected with the power conductor 90 and the prong 60. The common conductor 92 is coupled directly to the common prong 62, and the ground conductor 94 is coupled directly to the ground prong 64. All electric connections are made in a manner well-known in the art and are encapsulated within the integrally molded housing 12. The connections are therefore protected from exposure even upon rugged use of the housing.

ASSEMBLY AND OPERATION

Manufacture of the plug is initiated by making all electric connections which will be encapsulated within the plug housing 12. These connections are schematically illustrated in FIG. 5. Specifically, the power conductor 90 is coupled to one socket 54*b*, and the power prong 60 is coupled to the other socket 54*a*. The common wire 52 is coupled to the common prong 62; and the ground conductor 94 is coupled to the ground prong 64. The prong assembly 14 is then mounted within a mold insert which holds the prongs in position for subsequent molding. The insert can be rotated through 360 degrees so that the prong assembly 14 can be installed at any desired angular orientation to the housing axis 30.

After all electric connections have been made, the housing 12 is injection molded onto the power cord 18 and the prong assembly 14. During molding, all electric connections are encapsulated within the housing 12.

After the housing cures, the circuit breaker 16 is installed within the chamber 50. As the circuit breaker is slid into the chamber, the prongs 84 slide into slots to establish electric connection with the power conductor 90 and the power prong 60 such that the circuit breaker is coupled in series with the power prong 60. Also as the breaker is slid into position, the fingers 86 engage the chamber walls and are slightly compressed thereby. Breaker insertion continues until the facing 82 extends slightly into perimeter 56. The compressed fingers 86 provide a ratcheting effect to prevent inadvertent removal of the breaker from the housing 12.

The plug can be mounted on any appliance power cord or in conjunction with any device requiring electric power. The plug has its greatest utility in conjunction with appliances which draw large currents such as table saws or other devices with relatively large electric motors. Whenever the appliance or device draws excessive current, the circuit breaker 16 trips to interrupt power to the power prong 60 and consequently to the device powered by the cord. After corrective action has been taken to remedy the over-current situation, the breaker 16 is reset simply by depressing the reset button 88. The plug therefore provides infinitely resettable over-current protection for the appliance.

Figure 6:
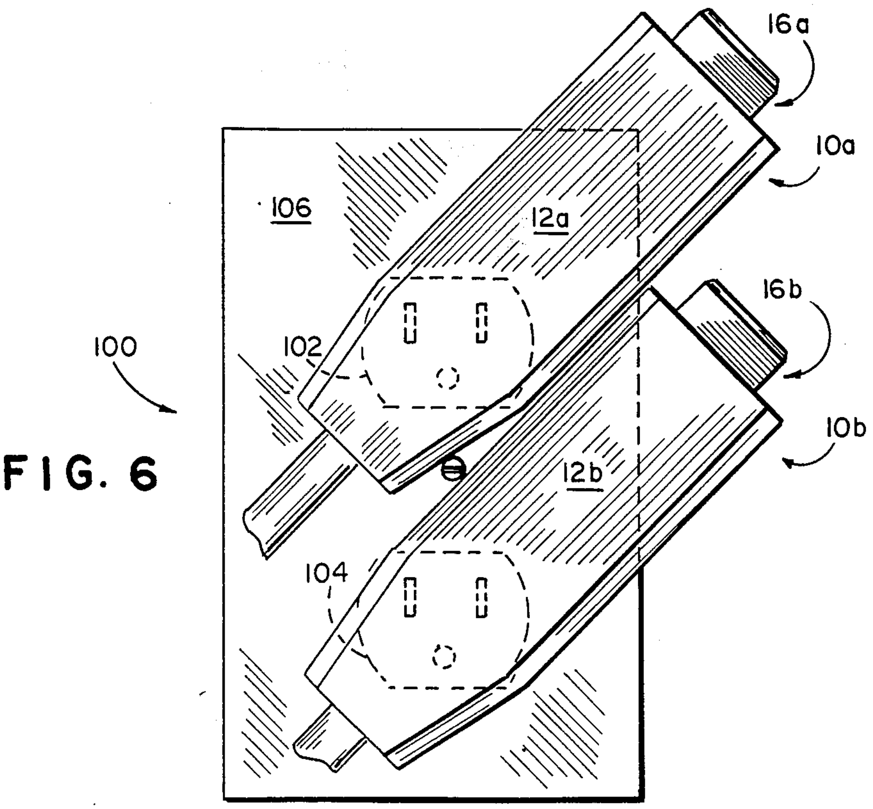
FIG. 6 is an elevational view of two of the plugs mounted in a duplex outlet.

The desirability of the angular orientation of the prong assembly 14 is illustrated in FIG. 6. Two plugs 10*a* and 10*b* are illustrated mounted side-by-side within a conventional duplex outlet 100 including an upper outlet 102, a lower outlet 104, and a cover plate 106. The angular orientation of the prong assemblies (not visible) of the plugs 10*a* and 10*b* orients the elongated plug housings 12a and 12b at an angle with respect to the receptacle 100. Consequently the elongated housings 12a and 12b do not overlap or otherwise restrict access to the adjacent outlets. If the angle between the line 70 and the axis 30 (FIG. 2) were 90 degrees, the housings 12a and 12b would undesirably overlie the adjacent receptacle outlets. Conversely, if the line 70 and the axis 30 are parallel, the housings 12a and 12b will be oriented generally horizontally. The optimal range for the angle between the line 70 and the axis 30 is in the range of zero degrees to approximately forty-five degrees to prevent this overlapping problem. In any event, the circuit breakers 16a and 16b of the plugs 10i a and 10b, respectively, are readily accessible for resetting even when the plugs are in the outlets.

The present plug provides a low profile plug with an integral circuit breaker. The low profile enhances safety and the security of the plug within the receptacle. The integral circuit breaker enables power to be easily reestablished without accessing the fuse box or circuit breaker box through which the circuit is connected.

The above description is that of a preferred embodiment of the invention. Various alterations and changes can be made without departing from the spirit and broader aspects of the invention as set forth in the appended claims, which are to be interpreted in accordance with the principles of patent law including the doctrine of equivalents.

The embodiments of the invention in which an exclusive property or privilege is claimed are defined as follows:

1. An electric plug comprising:

an elongated body having a longitudinal axis and a pair of opposite ends, said body further having a front face between said opposite ends, one of said ends adapted to receive a power cord in a direction generally parallel to said front face; and a pair of power prongs extending from said front face in a direction generally perpendicular to said body axis, said power prongs being oriented such that a line drawn through said power prongs forms an angle with said body axis, said angle in the range zero degrees to approximately forty-five degrees, whereby said prongs can be inserted into one receptacle of a duplex outlet and said elongated body will not overlie an adjacent receptacle.

2. An electric plug as defined in claim 1 wherein the other of said ends is adapted to receive power-interrupt means in a direction generally parallel to said front face.

3. An electric plug as defined in claim 2 wherein said body defines a chamber opening through the other of said ends, and further wherein said power-interrupt means is slidably received within said chamber and electrically connected in series with one of said prongs, and further wherein said power-interrupt means includes spring-loaded ratchet means for permitting said power-interrupt means to slide into said body and for preventing said power-interrupt means from being removed from said body.

4. An electric plug as defined in claim 1 wherein said body includes a pair of opposite sides, and further comprising a pair of parallel ridges, one on each of said opposite sides of said body and extending outwardly therefrom, said ridges being oriented in the longitudinal direction of the body to facilitate grasping of said body.

* * * * *